United States Patent
Amos et al.

(10) Patent No.: US 7,326,610 B2
(45) Date of Patent: Feb. 5, 2008

(54) PROCESS OPTIONS OF FORMING SILICIDED METAL GATES FOR ADVANCED CMOS DEVICES

(75) Inventors: Ricky S. Amos, Rhinebeck, NY (US); Douglas A. Buchanan, Winnipeg (CA); Cyril Cabral, Jr., Ossining, NY (US); Evgeni P. Gousev, Mahopac, NY (US); Victor Ku, Tarrytown, NY (US); An Steegen, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 11/271,032

(22) Filed: Nov. 10, 2005

(65) Prior Publication Data
US 2006/0105515 A1 May 18, 2006

Related U.S. Application Data

(63) Continuation of application No. 10/605,261, filed on Sep. 18, 2003, now Pat. No. 7,029,966.

(51) Int. Cl.
*H01L 21/31* (2006.01)
(52) U.S. Cl. .............. 438/231; 438/592; 257/E21.59; 257/E21.636
(58) Field of Classification Search .............. 438/199, 438/231, 592
See application file for complete search history.

(56) References Cited

U.S. PATENT DOCUMENTS

| | | | |
|---|---|---|---|
| 5,723,893 A | 3/1998 | Yu et al. | |
| 6,147,388 A | 11/2000 | Ma et al. | |
| 6,180,501 B1 | 1/2001 | Pey et al. | |
| 6,277,719 B1 * | 8/2001 | Chern et al. | 438/585 |
| 6,465,312 B1 * | 10/2002 | Yu | 438/300 |
| 2004/0038435 A1 * | 2/2004 | Wieczorek et al. | 438/13 |

* cited by examiner

*Primary Examiner*—Alexander Ghyka
(74) *Attorney, Agent, or Firm*—DeLio & Peterson, LLC; Robert Curcio; Lisa U. Jaklitsch

(57) ABSTRACT

Silicide is introduced into the gate region of a CMOS device through different process options for both conventional and replacement gate types processes. Placement of silicide in the gate itself, introduction of the silicide directly in contact with the gate dielectric, introduction of the silicide as a fill on top of a metal gate all ready in place, and introduction the silicide as a capping layer on polysilicon or on the existing metal gate, are presented. Silicide is used as an option to connect between PFET and NFET devices of a CMOS structure. The processes protect the metal gate while allowing for the source and drain silicide to be of a different silicide than the gate silicide. A semiconducting substrate is provided having a gate with a source and a drain region. A gate dielectric layer is deposited on the substrate, along with a metal gate layer. The metal gate layer is then capped with a silicide formed on top of the gate, and conventional formation of the device then proceeds. A second silicide may be employed within the gate. A replacement gate is made from two different metals (dual metal gate replacement) prior to capping with a silicide.

13 Claims, 16 Drawing Sheets

Pre high temp processes:

Post high temp processes:

Pre high temp processes:

Post high temp processes:

Pre high temp processes:

Post high temp processes:

Post source/drain/gate silicide (assumed $CoSi_2$)

Pre silicide formation:

Post silicide formation:

Post high temp processes:

Pre silicide formation:

Post silicide formation:

Post high temp processes:

Pre silicide formation:

Post silicide formation:

Post high temp processes:

PROCESS OPTIONS OF FORMING SILICIDED METAL GATES FOR ADVANCED CMOS DEVICES

BACKGROUND OF THE INVENTION

1. Field of the Invention

The present invention relates to the fabrication of integrated circuit devices on semiconductor substrates, and more particularly to CMOS transistor fabrication methods for forming silicided metal gates.

2. Description of Related Art

Throughout the prior art, metal gate integration has proved difficult to achieve in a conventional process flow for CMOS transistors. Most metal gate materials are easily etched when exposed to the standard CMOS cleans for conventional processing, such as sulfuric peroxide (SP) cleans, hydrogen fluoride (HF) etches, and the like. Initial attempts to mitigate this etching concern has centered on capping the metal gate layer with polysilicon. This method, however, is highly subject to interface effects and introduces typical polysilicon resistance related issues. In conventional gate electrodes using polysilicon/silicide, such as Poly-Si/$WSi_x$, the increased resistance causes a large gate RC delay, thereby degrading performance. Generally, resistance is reduced by preventing detrimental transition-metal reactions during processing, particularly with oxygen.

The protection of the metal gate during conventional processing against transistor performance degradation, such as $T_{inv}$-equivalent thickness of gate capacitance, $I_{on}$ source to drain current when device is on, and R-resistance of gate stack, is especially important when the metal is prone to degradation through unwanted etching and cross-contamination. Significantly, a process that protects the metal gate while allowing for the source and drain silicide to be of a different silicide than the gate silicide yields performance dividends and reduces complexity. Voltage threshold tailoring through metal gate implementation is also desirable, and may be achievable if a metal gate protection scheme can be implemented at the onset.

The current prior art has not sufficiently accounted for unwanted etching of the metal gate surface during cleans or cross-contamination during processing. In addition, predetermined voltage tailoring using various metal gates and metal silicides remain desirable goals during CMOS processing.

Bearing in mind the problems and deficiencies of the prior art, it is therefore an object of the present invention to provide a CMOS fabrication process for metal gate protection.

It is another object of the present invention to provide a method for sealing a metal gate by spacer and capping silicide, which allows for cleans and minimizes cross contamination.

A further object of the invention is to provide a method for metal gate protection that allows the source/drain silicide to be different than the gate silicide.

It is yet another object of the present invention to provide a method for metal gate protection that enables a wet etch for gate metal and minimizes gate dielectric attack or damage.

Still other objects and advantages of the invention will in part be obvious and will in part be apparent from the specification.

SUMMARY OF THE INVENTION

The above and other objects and advantages, which will be apparent to one of skill in the art, are achieved in the present invention, which is directed to in a first aspect, a method for forming a complementary metal oxide semiconductor (CMOS) device, comprising: providing a semi conducting substrate having a gate with a source and a drain region; depositing a gate dielectric layer on the semi conducting substrate; depositing a metal gate layer; capping the metal gate layer with a silicide formed on top of the gate; and performing conventional formation of the CMOS device. The metal gate layer comprises a metal or metal alloy. The gate dielectric layer comprises $Al_2O_3$, $HfO_2$, $ZrO_3$, $Y_2O_3$, $La_2O_3$, $SiO_2$, nitrided $SiO_2$, $Si_3N_4$, silicates, metal oxides or mixtures and nitrogen additions thereof. The metal gate layer comprises Ru, Rh, W, Mo, Re, Ir, Pt, TiN, TaN, or TaSiN. The method further comprises capping the metal gate layer with $CoSi_2$, NiSi, $TiSi_2$, $WSi_2$, $TaSi_2$, $MOSi_2$, PdSi, PtSi or mixtures thereof, or with a NiSi, $CoSi_2$, $TiSi_2$, or $WSi_2$ silicide.

In a second aspect, the present invention is directed to a method of forming a gate metal silicide for CMOS devices on a semiconductor wafer comprising: depositing a gate dielectric layer on the wafer; depositing a metal gate layer over the gate dielectric layer; depositing a silicon layer over the metal gate layer; patterning the wafer to form gates; depositing sidewall spacer material; etching the wafer to form sidewall spacers; performing source and drain ion implantation; and annealing the wafer at a temperature sufficient to activate implantation species and form a silicide of the gate silicon layer. Depositing the silicon layer comprises depositing a silicon layer thinner than the metal gate layer such that the entire polysilicon layer is consumed in the silicide formation. Depositing the silicon layer comprises depositing a silicon layer thicker than the metal gate layer such that the metal gate and polysilicion layers are consumed in the silicide formation. Depositing the silicon layer comprises depositing a silicon layer thicker than the metal gate layer such that the entire metal gate layer is consumed in silicide formation. Depositing the metal layer comprises depositing Co, W, Mo, Ru, Re, Rh, or Ir. Depositing the metal layer may further comprise depositing Ni, Co, W, or Mo. Depositing the metal layer comprises depositing Ni, Co, W, Pd, Pt, Ru, Re, Rh, Ir or Mo. Depositing the metal gate layer comprises depositing the metal layer with alloy additives in the range of 0.1 to 50 at. % of C, Al, Ti, V, Cr, Mn, Fe, Co, Ni, Cu, Ge, Zr,N Nb, Mo, Ru, Rh, Pd, Sn, Hf, Ta, W, Re, Ir, or Pt. The method further comprises forming a third silicide on the polysilicon layer. The third silicide may comprise $COSi_2$, NiSi, $WSi_2$, $TiSi_2$, PtSi, and PdSi. The first silicide of said silicon layer may be different from said second silicide of the source and drain implantation regions.

In a third aspect, the present invention is directed to a method of forming a gate metal silicide for CMOS devices on a semiconductor wafer prior to gate definition, comprising: depositing a gate dielectric layer on the wafer; depositing a gate metal layer over the gate dielectric layer; depositing a silicon layer over the gate metal layer; annealing the wafer to form silicide; patterning the wafer to form gates after the annealing process; depositing an oxide as a sidewall spacer; and annealing the wafer at a temperature sufficient to activate implantation species. Depositing the metal layer comprises depositing Co, W, Mo, Ru, Rh, Re, or Ir. The method further comprises forming a second silicide layer of a metal different than the gate metal layer over the silicon layer, the second silicide layer comprising Co, W, Ti, Ta, Ni, or Mo. The method may further comprise depositing a silicide metal layer over the gate metal layer. The method may also comprise depositing a barrier layer over the metal layer to prevent silicide formation of the gate metal layer. The barrier layer comprises graded nitride compositions. The graded nitride compositions comprise TiN, TaSiN, WN, TiAlN or TaN. The method further comprises sealing said gate metal layer by said sidewall spacer, and capping said metal layer with said silicide. Depositing the silicon layer over the gate metal layer may comprise using a physical vapor deposition process or a chemical vapor deposition process. Depositing the metal gate may also comprise using PVD, CVD, atomic layer deposition (ALD), or metal organic chemical vapor deposition (MOCVD) processes. The method may also use photolithography and RIE sequences for said pattering of said wafer. The method further includes depositing the gate metal at a thickness of approximately 5 to 30 nanometers.

In a fourth aspect, the present invention is directed to a method of forming a replacement gate structure for CMOS devices on a semiconductor wafer, comprising: providing a patterned gate structure having a sacrificial gate dielectric, sidewall spacers, shallow trench isolation, source and drain ion implantation regions, and a polysilicon layer over the gate dielectric; depositing a $Si_3N_4/SiO_2$ bilayer surrounding the gate region; removing the polysilicon layer and sacrificial gate dielectric; growing the gate dielectric over the patterned gate structure; depositing a metal gate liner over the gate dielectric; depositing a silicon layer over the metal liner; planarizing structure using chemical mechanical polishing (CMP); depositing a silicide metal layer; annealing the gate structure; and removing any unreacted metal. The method may comprise annealing the gate structure to decrease the resistance of the silicide fill. The silicide metal layer comprises Ni, Co, Ti, Ta, W, Mo, Pd or Pt. The metal gate liner includes TaN, TiN, or TaSiN, Ru, Rh, Re, Ir, W or Mo. The method further comprises depositing a silicide barrier liner over the metal gate liner, and depositing a silicon gate fill over the barrier.

In a fifth aspect, the present invention is directed to a method of forming an interconnect on a dual metal replacement gate structure for connection of nFET and pFET gates of a CMOS device on a semiconductor wafer, comprising: providing a patterned gate structure having a sacrificial gate dielectric, sidewall spacers, shallow trench isolation, source and drain ion implantation regions, and a first and a second doped polysilicon regions over the sacrificial gate dielectric; removing the first N+doped polysilicon region and a portion of the sacrificial gate dielectric; depositing a first dielectric; depositing a first nFET metal in place of the first N+doped polysilicon region; depositing an undoped poly over the first nFET metal; performing chemical mechanical polishing on the wafer; removing the second P+doped polysilicon region and a portion of the sacrificial gate dielectric; depositing a second dielectric; depositing a second pFET metal in place of the second P+doped polysilicon region; depositing an undoped poly over the second pFET metal; performing chemical mechanical polishing on the wafer; performing an etch on the first and second metals between the first and second polysilicon regions; depositing a blanket polysilicon layer over the wafer; planarizing the deposited polysilicon; depositing a metal over the polysilicon layer; and performing silicidation of the metal. The method further comprises forming a metal oxide layer between the first and second metals. Depositing metal over the polysilicon comprises Ni, Co, Ti, Ta, W, Mo, Pd or Pt.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
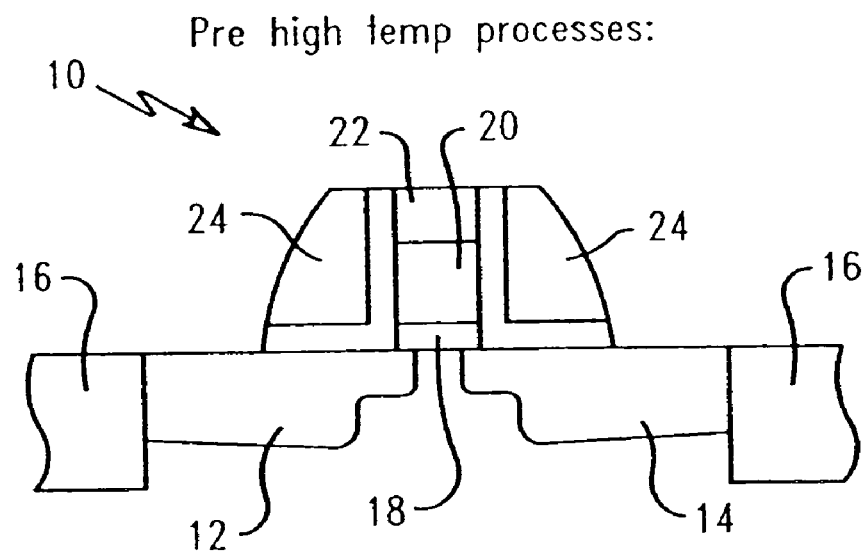
FIG. 1A depicts a CMOS metal gate formed with a polysilicon cap.

In describing the preferred embodiment of the present invention, reference will be made herein to FIGS. 1-10 of the drawings in which like numerals refer to like features of the invention. Features of the invention are not necessarily shown to scale in the drawings.

Referring to FIG. 1, one embodiment of the process includes employing a thin polysilicon gate layer relative to the metal thickness. FIG. 1A depicts a CMOS metal gate formed in a conventional process. Gate structure 10 is shown having source region 12 and drain region 14 adjacent to shallow trench isolations 16. The source and drain regions are formed by ion implantation below and adjacent to the sidewall spacers 24. Prior to administering a high temperature anneal, the pre-high temperature process includes depositing a gate dielectric 18, a metal layer 20, and a silicon layer 22 on top of the metal layer, all within the sidewall spacers 24 of the gate. The gate dielectric layer 18 may comprises metal oxides, such as $Al_2O_3$, $HfO_2$, $ZrO_3$, $Y_2O_3$, $La_2O_3$, $SiO_2$, nitrided $SiO_2$, $Si_3N_4$, and the like, or mixtures thereof. The mixtures may also have silicates or nitride additions. The metal gate layer may be deposits of Ru, Rh, W, Re, Ir, Co, or Mo, and the like. The silicon layer 22 may be deposited over the metal layer 20 using a physical vapor deposition process or a chemical vapor deposition process. The metal gate layer may be deposited by PVD, CVD, or atomic layer deposition (ALD), or metal organic chemical vapor deposition (MOCVD). Additionally, the silicide generated from the silicon layer may be distinctly different from the silicide used for the source and drain implantation.

Figure 1B:
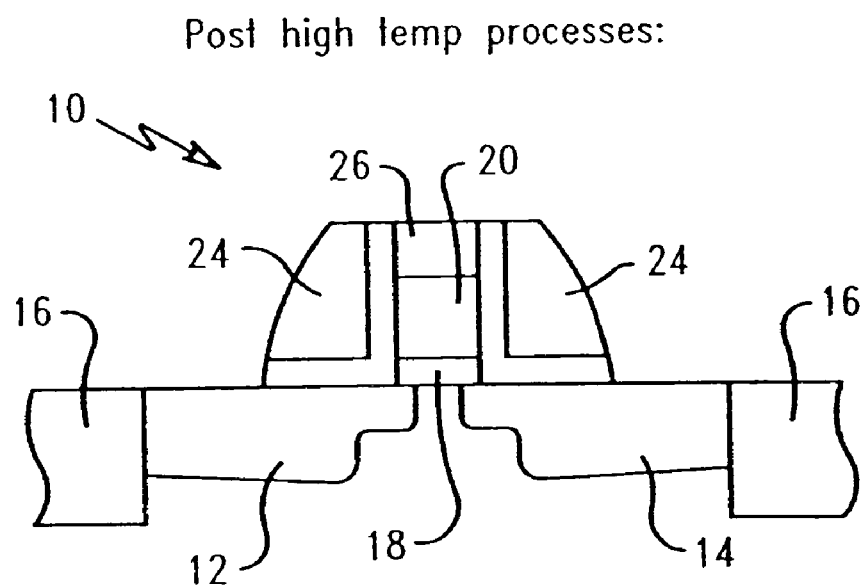
FIG. 1B depicts a gate structure with a silicide contact to the metal gate after a post high temperature anneal process.

The gate dielectric 18, metal layer 20, and silicon layer 22 are patterned to define a gate structure having sidewall spacers 24. The patterning may be performed using conventional photolithography and a reactive ion etch (RIE). A polysilicon layer or an oxide film may be used as a hard mask for the patterning of the gate. In this first embodiment, the metal layer 20 is shown to be substantially thicker than the silicon layer 22. FIG. 1B depicts gate 10 after a post high temperature anneal process. Silicon layer 22 is shown transformed into silicide layer 26, forming a cap over the metal layer 20. The formation of the CMOS gate then proceeds in a conventional manner.

Figure 2A:
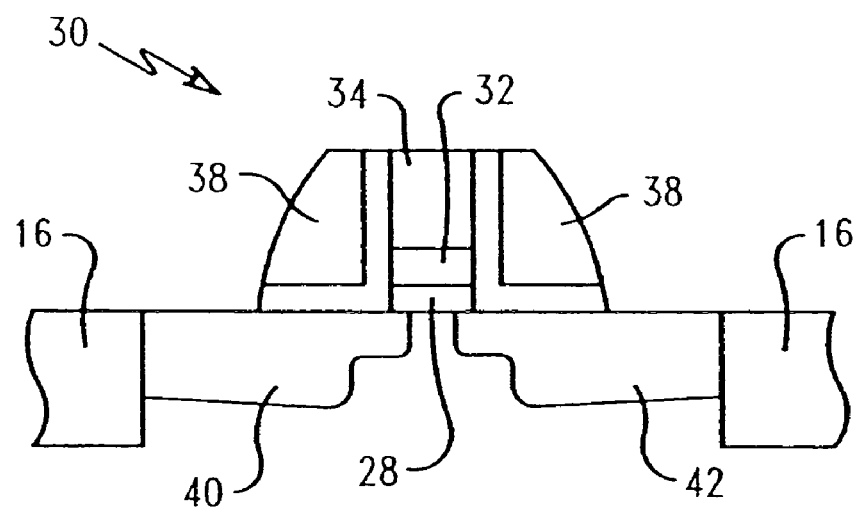
FIG. 2A depicts a gate structure having a polysilicon layer on a metal layer deposited within the gate prior to annealing.
Figure 2B:
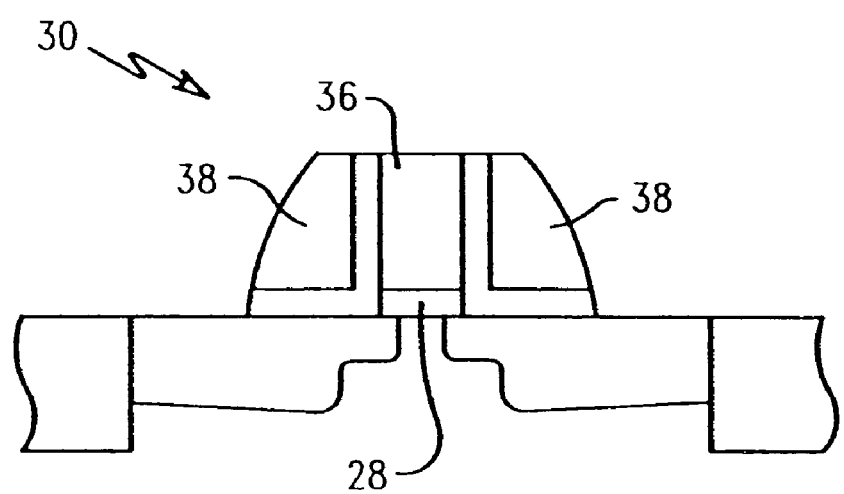
FIG. 2B depicts the post high temperature process of the gate of FIG. 2A with the formation of a silicide that consumes all of the polysilicon and metal gate layers.

In a second, similar embodiment, shown in FIG. 2, the silicon layer is deposited at a thickness greater than the metal layer it protects. FIG. 2A depicts a gate structure 30 having a thick polysilicon layer 34 relative to a thin metal layer 32 deposited within the gate prior to annealing. The polysilicon and metal layer thickness are determined such that after annealing the silicon and metal react completely to form a silicide. In this process the metal may comprise Ni, Co, W, Mo, and the like including alloying elements at a level of 0.1 to 50 at. % consisting of Al, Ti, V, Cr, Mn, Fe Co, Ni, Cu, Ge Zr, Nb, Mo, Ru, Rh, Pd, Ag, Sn, Hf, Ta, W, Re, Ir and Pt. The gate is defined by sidewall spacers 38, with source and drain regions 40, 42, respectively. FIG. 2B depicts the post high temperature process of the gate of FIG. 2A. The silicon layer 34 forms a silicide layer 36 completely consuming the polysilicon over the gate dielectric. As with the first embodiment, the gate dielectric 28, metal layer 32, and silicon layer 34 are patterned prior to annealing with a defining gate structure having sidewall spacers 38. The patterning may be performed using conventional photolithography and a reactive ion etch (RIE).

Figure 3A:
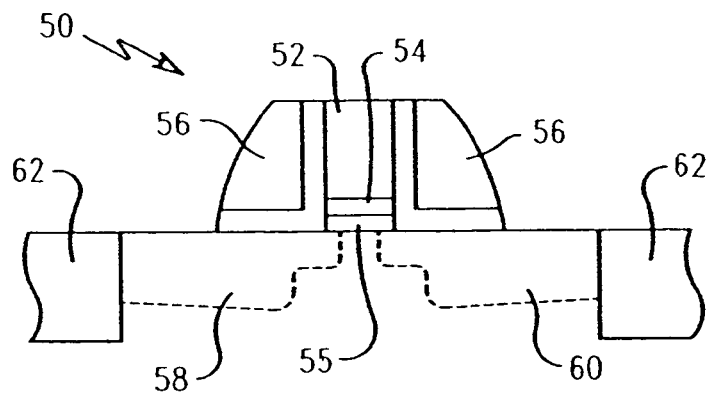
FIG. 3A depicts a CMOS gate structure having a thick polysilicon layer relative to a thin metal gate layer deposited within the gate prior to annealing.
Figure 3B:
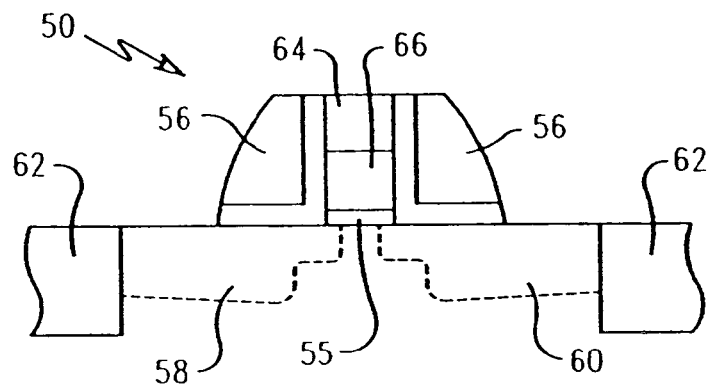
FIG. 3B depicts the gate structure of FIG. 3A after high temperature annealing, wherein a gate metal forms a first silicide without consuming the entire polysilicon layer.
Figure 3C:
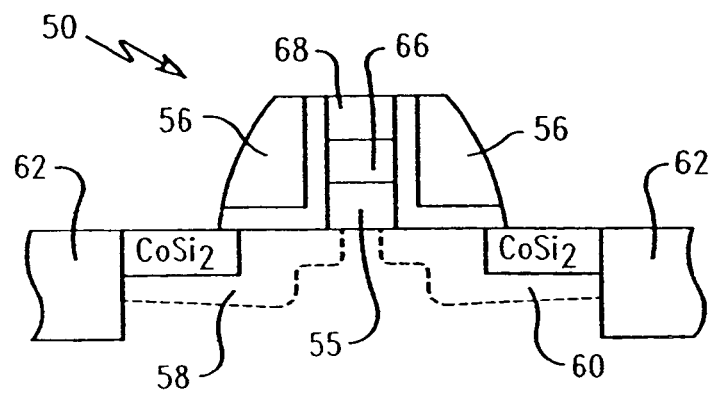
FIG. 3C depicts the post source/drain/gate silicide structure having a polysilicon layer between two silicides.

In a third embodiment, the gate may optionally have polysilicon sandwiched between two silicides. This configuration depends, in part, upon the overall stack height and layer thickness, among other factors. FIG. 3A depicts a CMOS gate structure 50 having a polysilicon layer fabricated on a metal gate layer. Prior to exposing gate structure 50 to annealing, a silicon layer 52 is deposited on a metal layer 54, which is over a gate dielectric 55. The silicon layer is within a gate structure defined by sidewall spacers 56, source region 58, drain region 60, and shallow trench isolation regions 62. The silicon layer 52 is thick relative to the metal layer 54. After high temperature annealing, a first silicide layer 66, as shown in FIG. 3B, is formed consuming the entire metal gate layer. Important to this embodiment, a second silicide layer 68 may be formed over the polysilicon layer 64. FIG. 3C depicts the post source/drain/gate silicide structure having a polysilicon layer 64 between two silicides 66, 68. Preferably, the second silicide layer 68 is $CoSi_2$ or NiSi, but may be other suitably compatible material. Once again, a conventional CMOS process flow would follow after this initial gate construction. In each of the first three embodiments, the metal layer within the gate is sealed by a spacer and capping polysilicon layer, which facilitates cleaning and minimizes cross contamination. Furthermore, depending upon the polysilicon thickness, other RIE advantages may be realized with the metal layer. Voltage tailoring using various metal gates and metal silicides may be promoted using this method, while source and drain silicides may be constructed of a different material than the gate silicide.

Figure 4A:
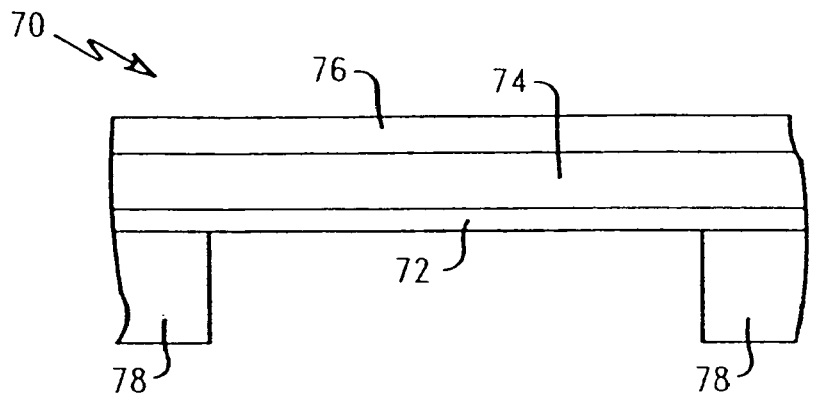
FIG. 4A depicts construction of a silicide contact on a metal gate prior to any gate definition where a blanket polysilicon layer is in contact with a metal gate layer.
Figure 4B:
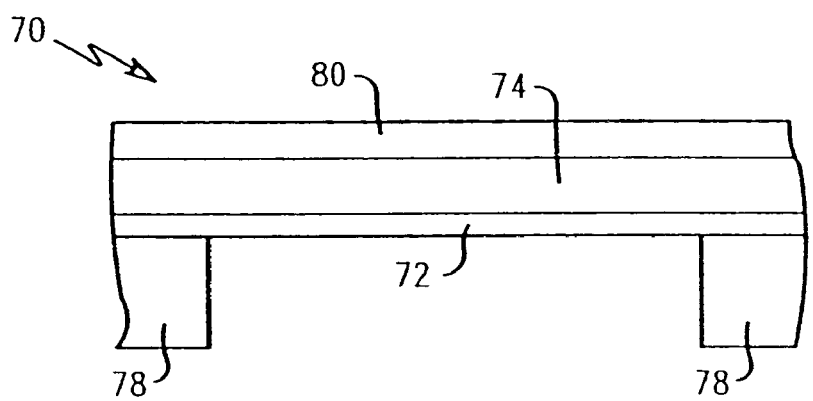
FIG. 4B depicts the gate structure of FIG. 4A after high temperature annealing thus forming the silicide contact to the metal gate.
Figure 4C:
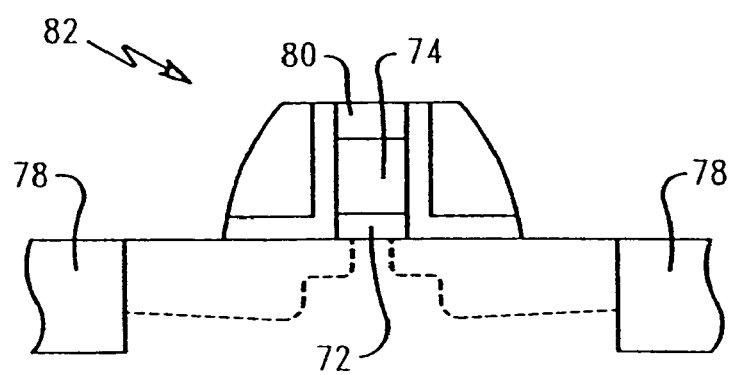
FIG. 4C depicts the gate structure of FIG. 4B having sidewall spacers, a source region, and a drain region fabricated during the post annealing processes.

FIG. 4 depicts, as a fourth embodiment, construction of the metal/silicide gate of the present invention prior to any gate definition. In the pre-silicide formation of FIG. 4A, gate dielectric layer 72, metal layer 74, and silicon layer 76 are deposited over shallow trench isolation regions 78 of substrate 70. The silicon may be deposited using PVD or CVD processes. After high temperature annealing, a silicide layer 80 is formed, as shown in FIG. 4B, over the metal layer 74 and gate dielectric layer 72. Unlike the previously described embodiments, the gate structure is formed after the high temperature process. FIG. 4C depicts a gate 82 formed having sidewall spacers 84, source region 86, and drain region 88, as a post silicide annealing process. In this process the gate metals may comprise Co, W, Mo, Ru, Rh, Re, Ir, and the like. The silicide formed is a reaction of the polysilicon with the gate metal.

Figure 5A:
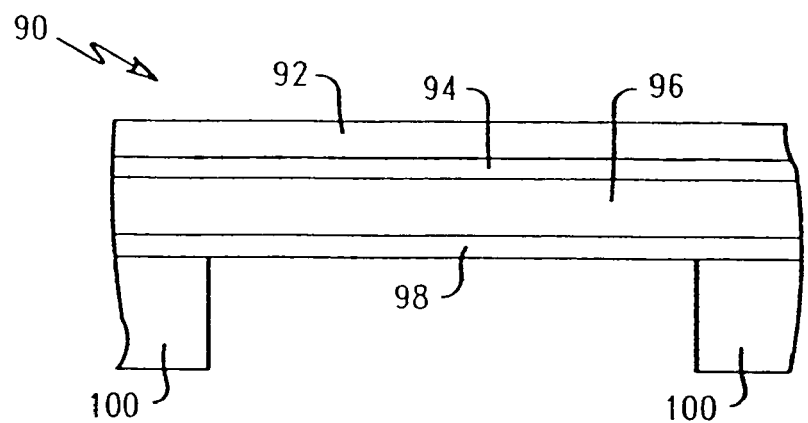
FIG. 5A depicts construction of a silicide contact metal made of a material different than the gate metal 96 used to cap the silicon layer on a gate metal prior to gate definition.
Figure 5B:
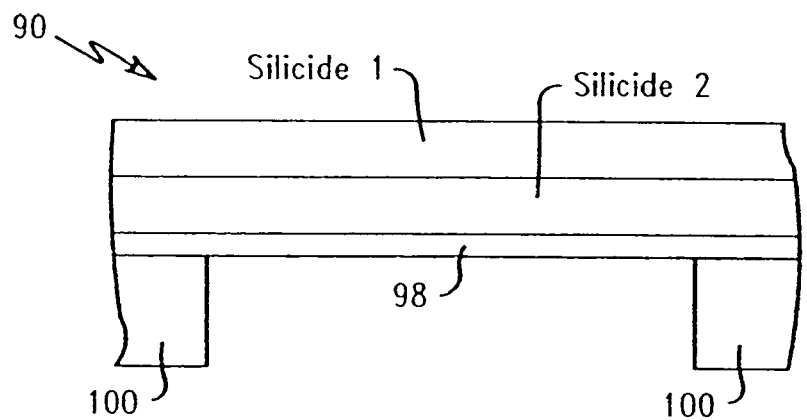
FIG. 5B represents substrate of FIG. 5A after high temperature annealing such that there are two different silicides formed above the gate metal.
Figure 5C:
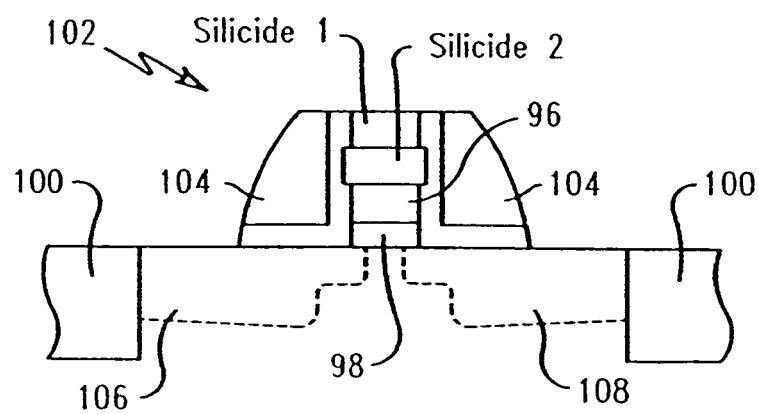
FIG. 5C depicts the gate structure of FIG. 5B having sidewall spacers, a source region, and a drain region, fabricated during post annealing processes.

In a fifth embodiment, shown in FIG. 5, construction of the metal/silicide gate of the present invention is again formed prior to any gate definition. As depicted in FIG. 5A, a silicide metal 92, preferably made of a material different than the gate metal 96 is used to cap the silicon layer 94. These layers are deposited over a gate dielectric layer 98 and shallow trench isolation regions 100 of substrate 90. FIG. 5B represents substrate 90 after high temperature annealing. Silicide metal layer 92 forms silicide 1, while polysilicon layer 94 forms silicide 2 over the gate metal 96. Care should be taken with regard to the selection of silicide materials and initial metal thickness. Polysilicon 94 may not form silicide 2 if the gate metal silicide forms at a higher temperature than the capping silicide 1. FIG. 5C depicts a gate 102 formed having sidewall spacers 104, source region 106, and drain region 108, as a post annealing processes.

Figure 6:
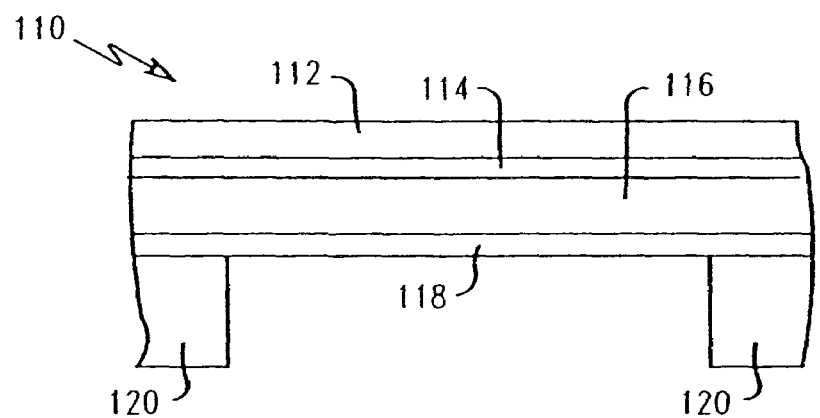
FIG. 6A depicts a layered substrate having a polysilicon layer over a silicide metal layer, which is of a metal different than gate metal.
FIG. 6B depicts substrate of FIG. 6A in a post silicide formation such that a silicide is in contact with the metal gate.
FIG. 6C depicts the patterned gate structure of FIG. 6B having a silicide layer, a gate metal layer, and a gate dielectric layer patterned into sidewall spacers, and over a source region, and a drain region fabricated during post silicide formation processes.
Figure 6:
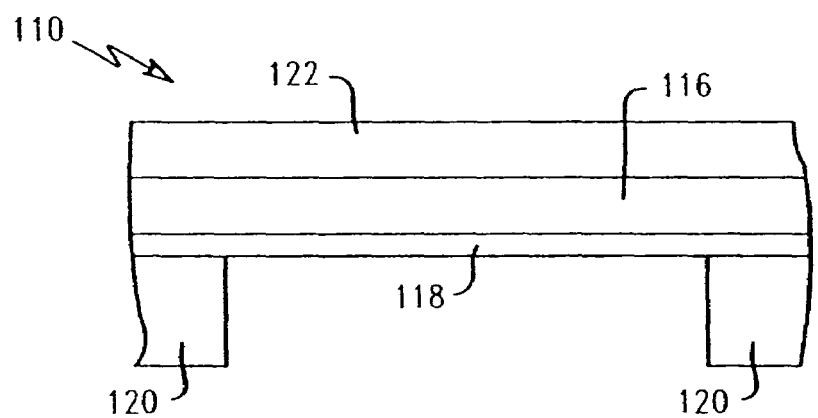
Figure 6:
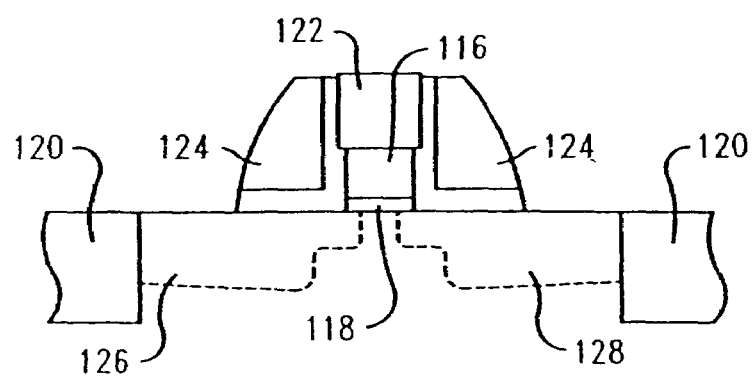

If the silicide metal formation temperature is lower than the gate metal silicide temperature, the polysilicon layer may be deposited over the silicide metal layer. FIG. 6 depicts the process of forming a capping silicide layer of a material different than the gate metal, in concert with this temperature scheme. One may also deposit a similar silicide metal, such that a similar capping scheme is realized. FIG. 6A depicts layered substrate 110 having a polysilicon layer 112 over a silicide metal layer 114, which is of a metal different than gate metal 116. These layers are placed over a gate dielectric 118 and shallow trench isolation regions 120. FIG. 6B depicts substrate 110 in a post silicide formation. After high temperature annealing, silicide layer 122 is formed over the gate metal layer 116 from the polysilicon layer 112 and silicide metal layer 114. Importantly, the metal silicide formation temperature is lower than the gate metal silicide formation temperature.

Subsequent to the high temperature annealing process, substrate 110 is then patterned into a gate structure using conventional CMOS processes. FIG. 6C depicts silicide layer 122, gate metal layer 116, and gate dielectric layer 118 patterned into a gate structure having sidewall spacers 124, source region 126, and drain region 128. The patterning may take place using the silicide itself as the hard mask, or more conventionally, using an oxide film.

Figure 7:
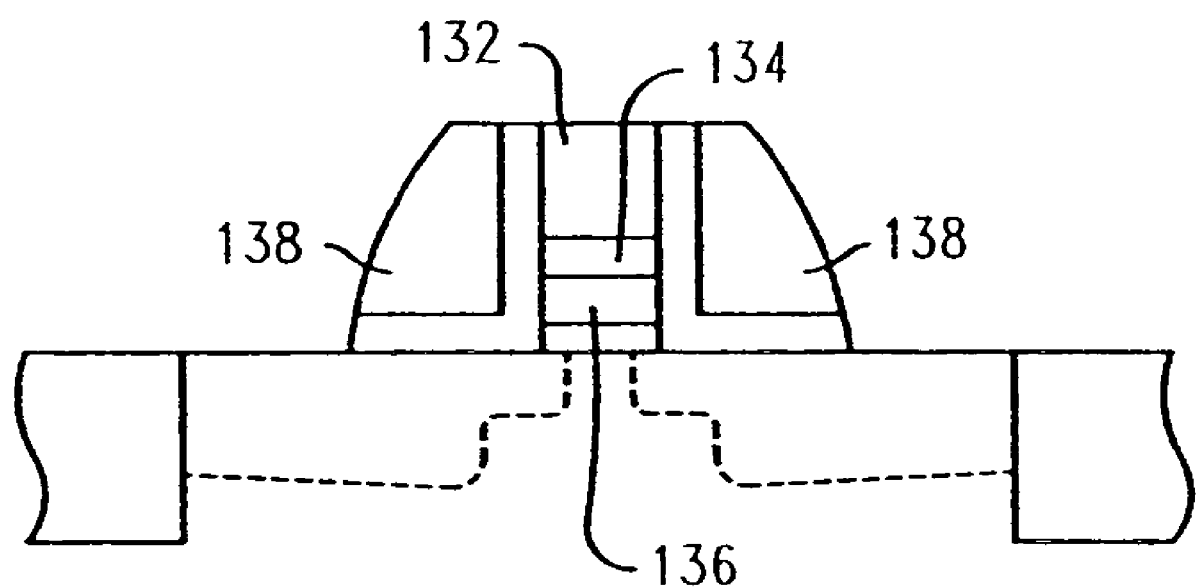
FIG. 7 depicts a gate structure having a barrier layer formed over a gate metal layer to prevent silicide formation.
Figure 8A:
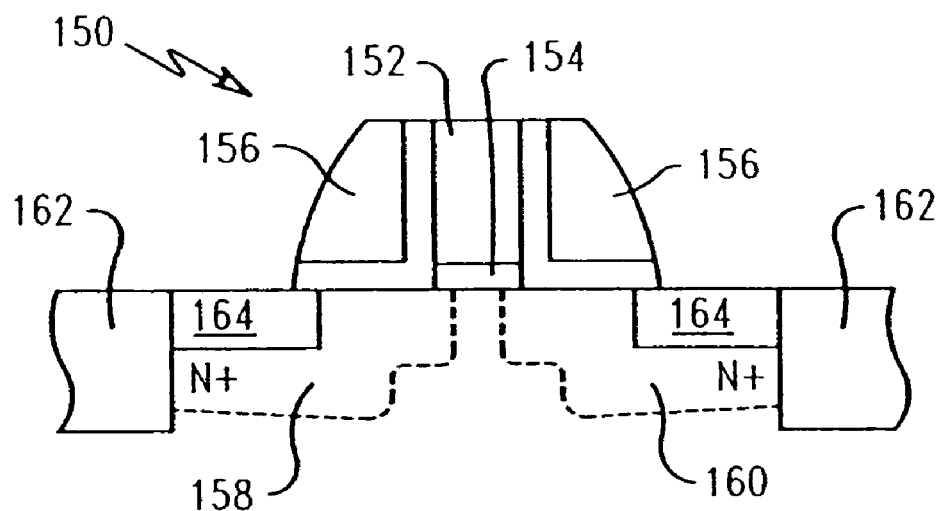
FIG. 8A shows a CMOS device structure in a conventional CMOS process flow to be used in a replacement gate integration flow.
Figure 8B:
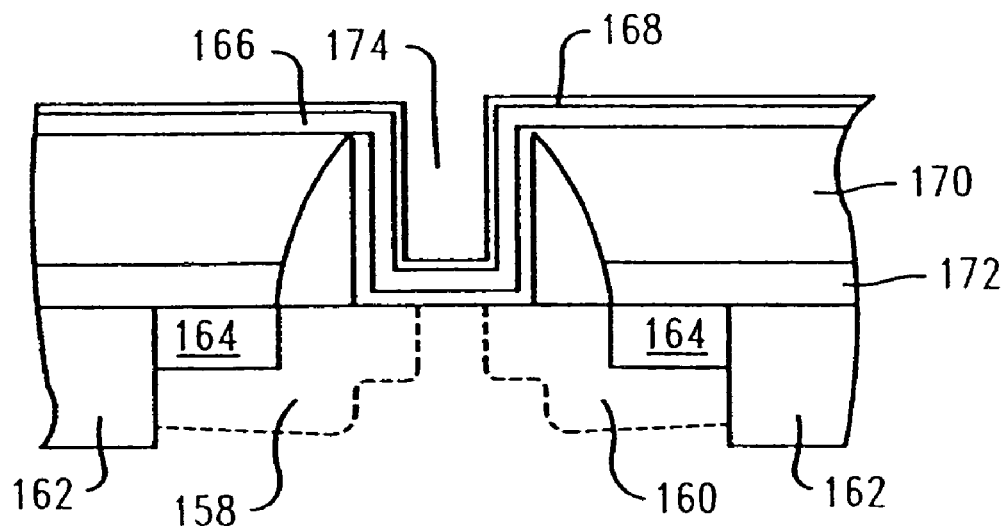
FIG. 8B depicts the gate structure of FIG. 8A with a gate dielectric layer grown, and a metal gate liner deposited over a $SiO_2$ layer and $Si_3N_4$ layer surrounding the gate structure in the replacement gate integration flow.
Figure 8C:
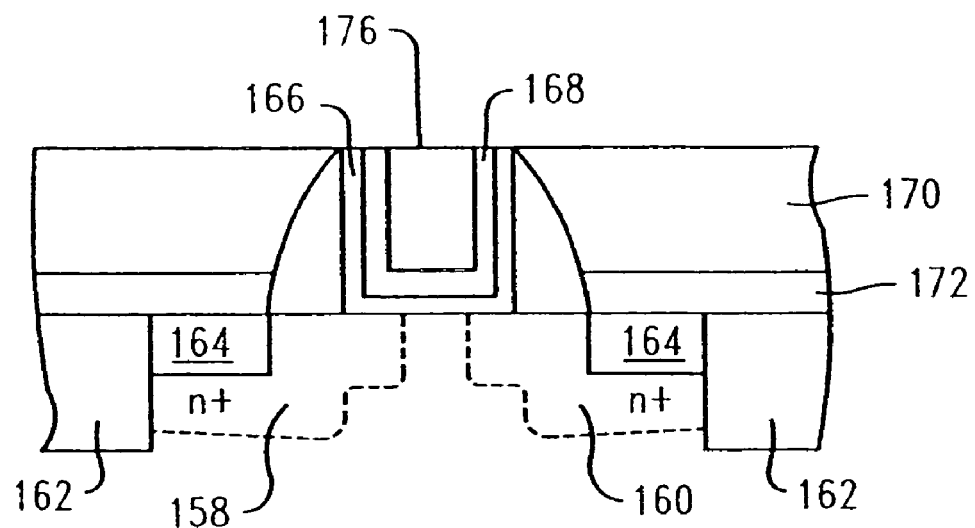
FIG. 8C depicts the gate structure of FIG. 8B with silicon deposited to fill the gate area on top of the gate metal.
Figure 8D:
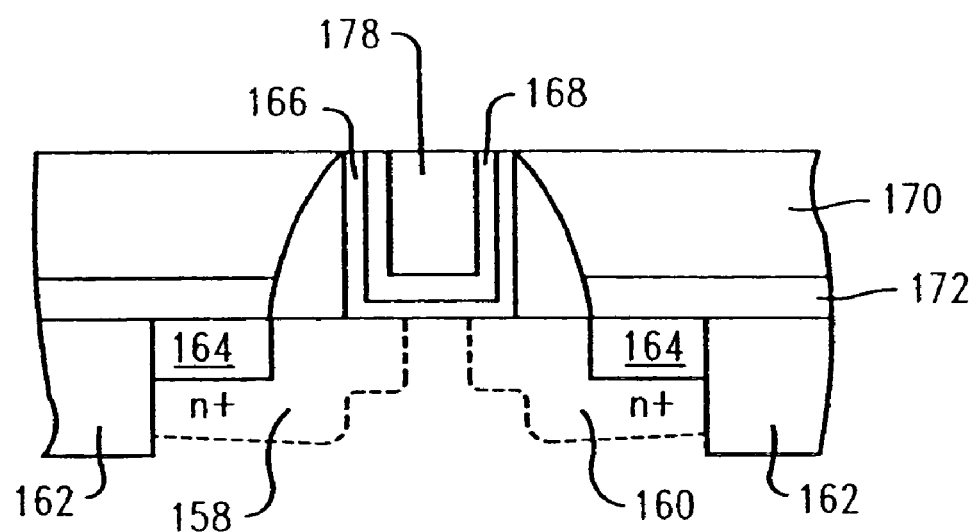
FIG. 8D depicts the final gate structure of FIG. 8C having a silicide fill in contact with the gate metal.

FIG. 7 depicts a sixth embodiment of the present invention. A barrier layer 134 is formed over the gate metal 136 in order to prevent silicide formation. Preferably, the barrier layer is comprised of TiN, TaSiN, TaN, WN, TiAlN, and the like. Polysilicon layer 132 is then formed on top of the barrier layer 134. The silicon is deposited using standard PVD or CVD processes. Using either the polysilicon or an oxide film as the hard mask, the gate structure is then patterned, and oxide is deposited for sidewall spacers 138. The patterning continues to be performed using conventional photolithography and a reactive ion etch (RIE). Through this embodiment, the gate metal is sealed by the barrier spacer and capping polysilicon, which facilitates cleaning and minimizes cross contamination. A thin gate metal, on the order of 5 to 30 nanometers, along with the barrier layer, may enable a wet etch of the gate metal. Due to the barrier protection, this embodiment demonstrates little or no gate dielectric damage.

FIG. 8 depicts a seventh embodiment of the present invention showing metal gate process options in a replacement gate CMOS process flow. A replacement gate is formed with a silicide fill for silicide formation at a temperature less than the metal gate silicide formation temperature. FIG. 8A shows the starting gate structure 150 having a polysilicon gate 152, a gate dielectric 154, sidewall spacers 156, source region 158, drain region 160, and shallow trench isolation regions 162 bounded by a layer of $CoSi_2$ 164 formed on the source/drain region. First, for the replacement gate process, the "original" gate is removed. Next, as shown in FIG. 8B, a gate dielectric layer 166 is grown, and a metal gate liner 168 is deposited over a $SiO_2$ layer 170 and $Si_3N_4$ layer 172 surrounding the gate structure. The gate metal liner is thin, on the order of 5 to 30 nanometers. The gate dielectric 166 and metal gate 168 layers do not completely fill the gate, leaving a gap 174 for the deposition of silicon. Silicon 176 is deposited as shown in FIG. 8C, filling the gate area. The structure is then subjected to a chemical-mechanical polishing (CMP) process for planarization. Next, silicide metal 178 is deposited on the gate structure, and the structure is annealed. Any unreacted metal is then removed and a possible second anneal is performed depending on the silicide being formed. This is the self-aligned silicide process (salicide) for formation of the silicide. FIG. 8D depicts the final gate structure having a silicide fill 178. This process alleviates any metal fill issues for the metal gate, and allows for more gate metal deposition options.

Figure 9A:
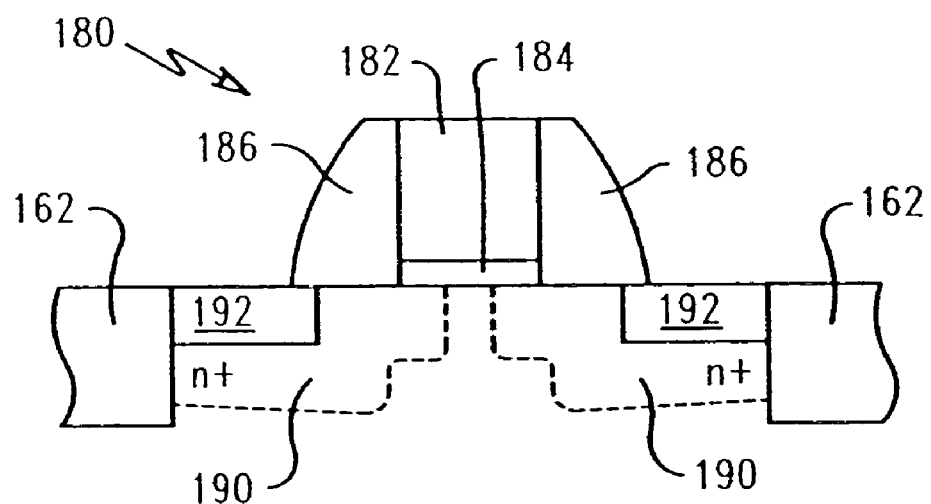
FIG. 9A depicts a CMOS device structure in a conventional CMOS process flow to be used in a replacement gate integration flow.
Figure 9B:
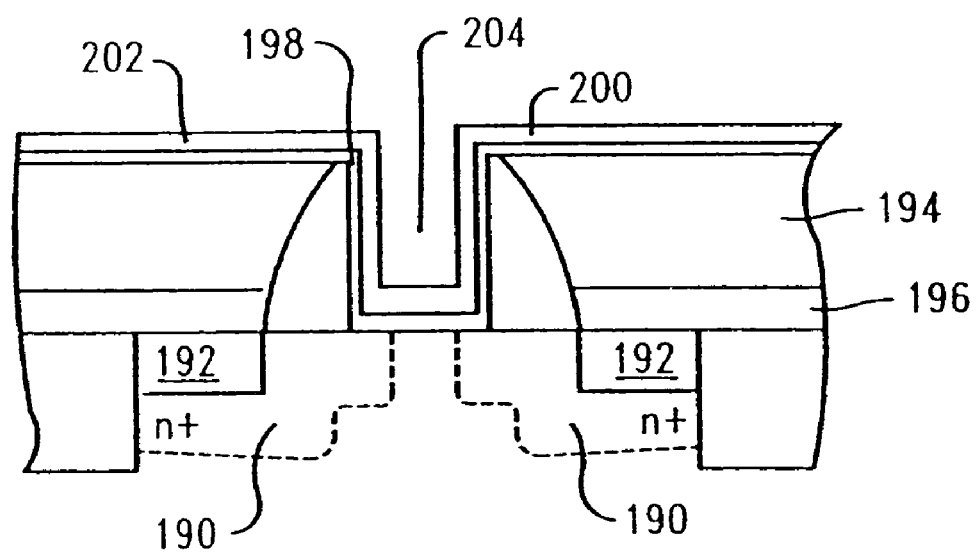
FIG. 9B depicts the gate structure of FIG. 9A having a $SiO_2$ layer and a $Si_3N_4$ layer deposited, surrounding the gate structure, with a gate dielectric grown, a metal gate liner deposited, and the silicide barrier layer deposited on top of the metal gate liner.
Figure 9C:
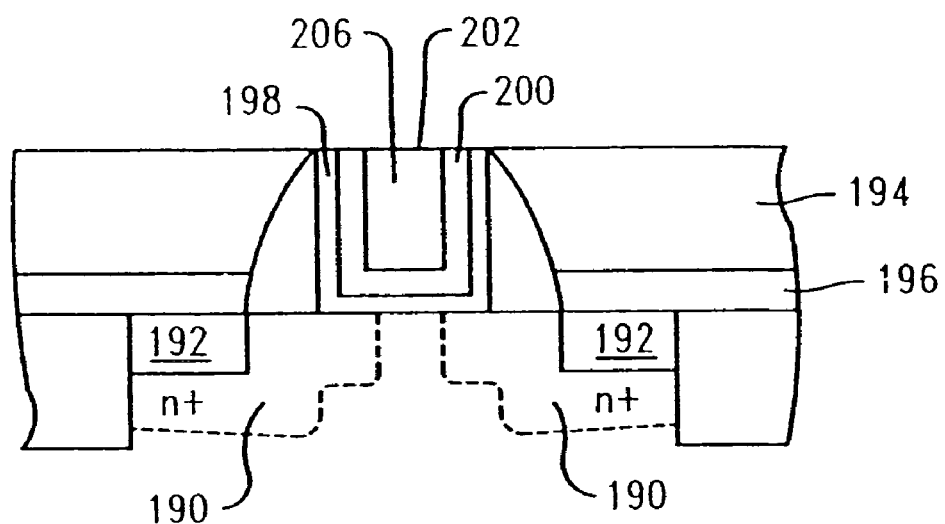
FIG. 9C depicts the gate structure of FIG. 9B with silicon deposited, filling the gate area.
Figure 9D:
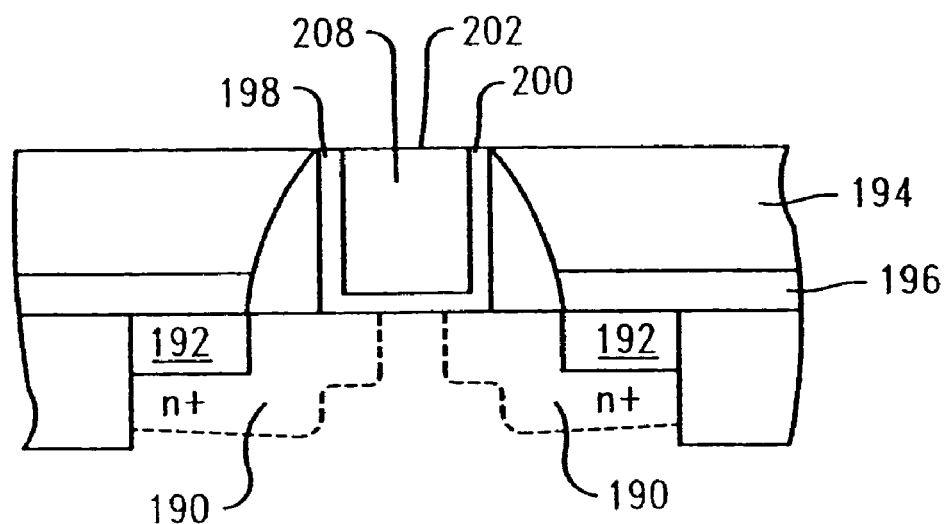
FIG. 9D depicts the final gate structure of FIG. 9C having a silicide fill over a barrier layer over the gate metal.

The replacement gate may also be filled with silicide and a barrier layer on the gate metal. FIG. 9A depicts a starting gate structure 180 having a polysilicon layer 182 and a gate dielectric layer 184 therein. Sidewall spacers 186 define the gate structure along with source 188, drain 190 and a $CoSi_2$ layer 192. As shown in FIG. 9B, a $SiO_2$ layer 194 and a $Si_3N_4$ layer 196 are deposited, surrounding the gate structure. Next, the original gate fill is then removed. A gate dielectric 198 is grown, a metal gate liner 200 deposited, and the silicide barrier layer 202 deposited on top of the metal gate liner 200. The gate dielectric 198, metal gate liner 200 and silicide barrier 202 layers do not completely fill the gate, leaving a gap 204 for the deposition of silicon. Silicon 206 is deposited as shown in FIG. 9C, filling the gate area. The structure is then subjected to a chemical-mechanical polishing (CMP) process for planarization. Next, silicide metal 208 is deposited on the gate structure, and the structure is annealed. Any unreacted metal is then removed and a possible second anneal is performed depending on the silicide being formed. The salicide process is followed. FIG. 9D depicts the final gate structure having a silicide fill 208 over a barrier 202. One possible metal for the low temperature silicide includes nickel, and the like. The barrier layer 202 generally comprises a nitride composition, such as TiN, TaN, WN, TiAlN, and TaSiN. The gate fill silicides include Ni, Co, Ti, Ta, W, Mo, Pt, Pd and the metal gate layers include graded composition nitrides, such as TaN, TiN, and TaSiN, and the like and Ru, Rh, Re, Mo, Ir, W and Pt.

Figure 10A:
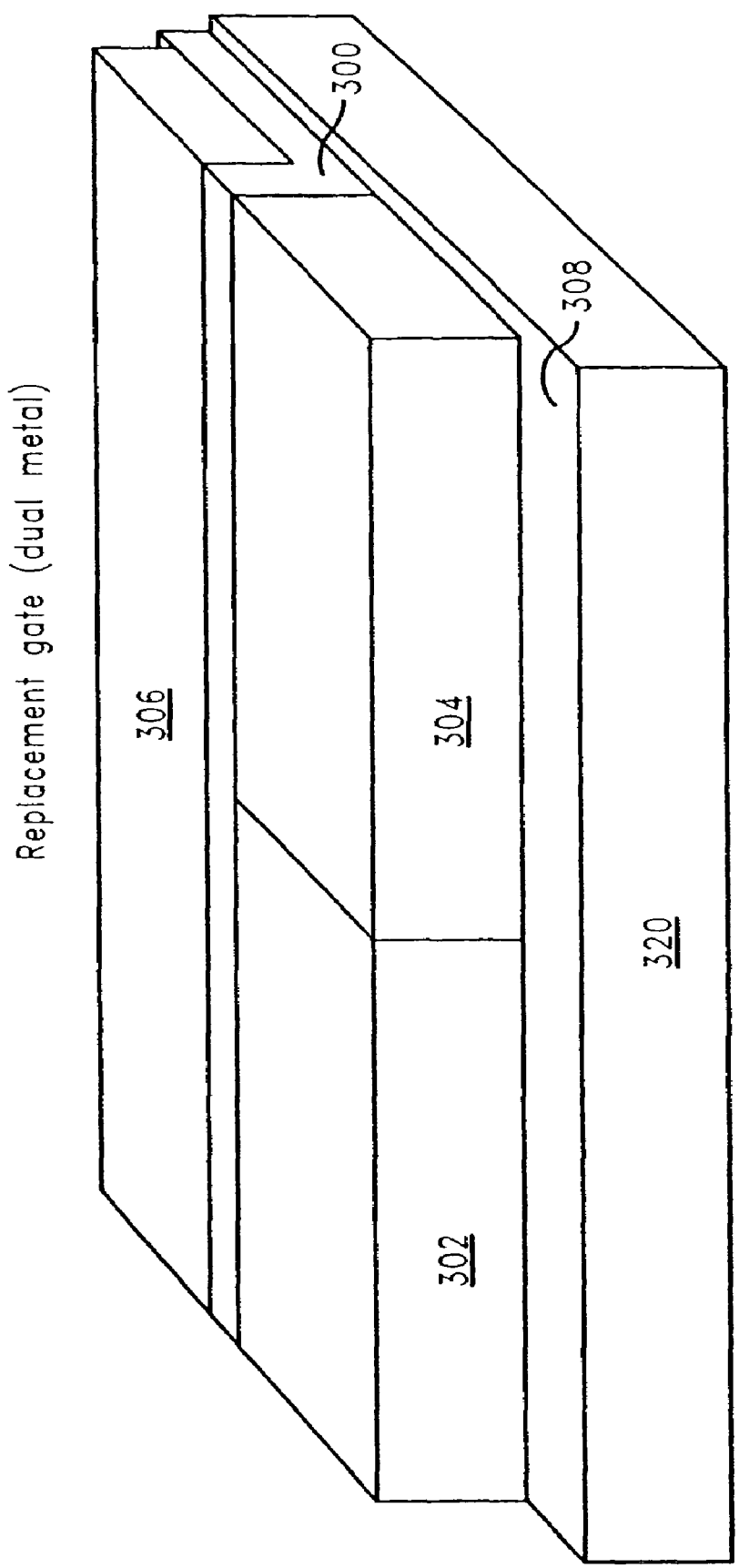
FIG. 10A depicts a CMOS dual metal gate being fabricated with the replacement gate integration technique.
Figure 10B:
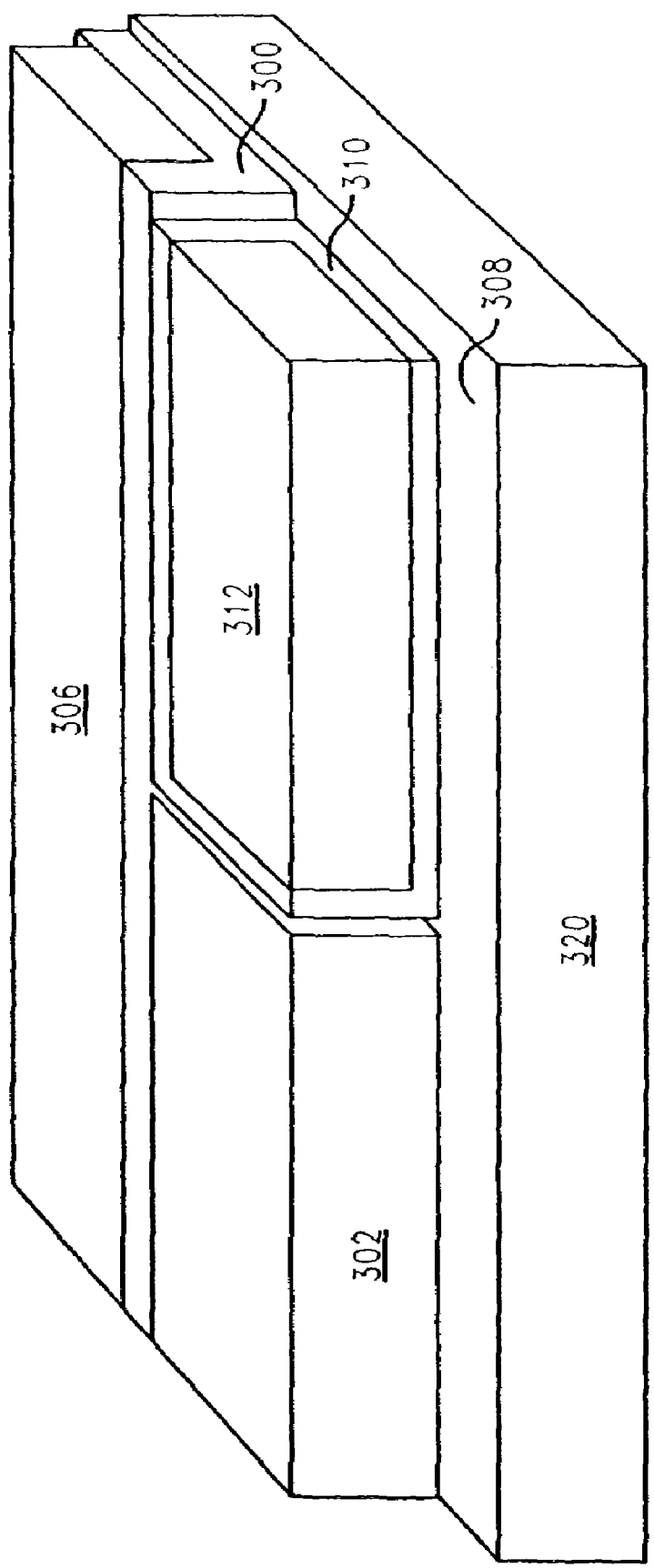
FIG. 10B depicts the dual metal nFET replacement gate of FIG. 10A having undoped poly, a NFET metal gate and a gate dielectric replacing the N+poly and sacrificial gate oxide.
Figure 10C:
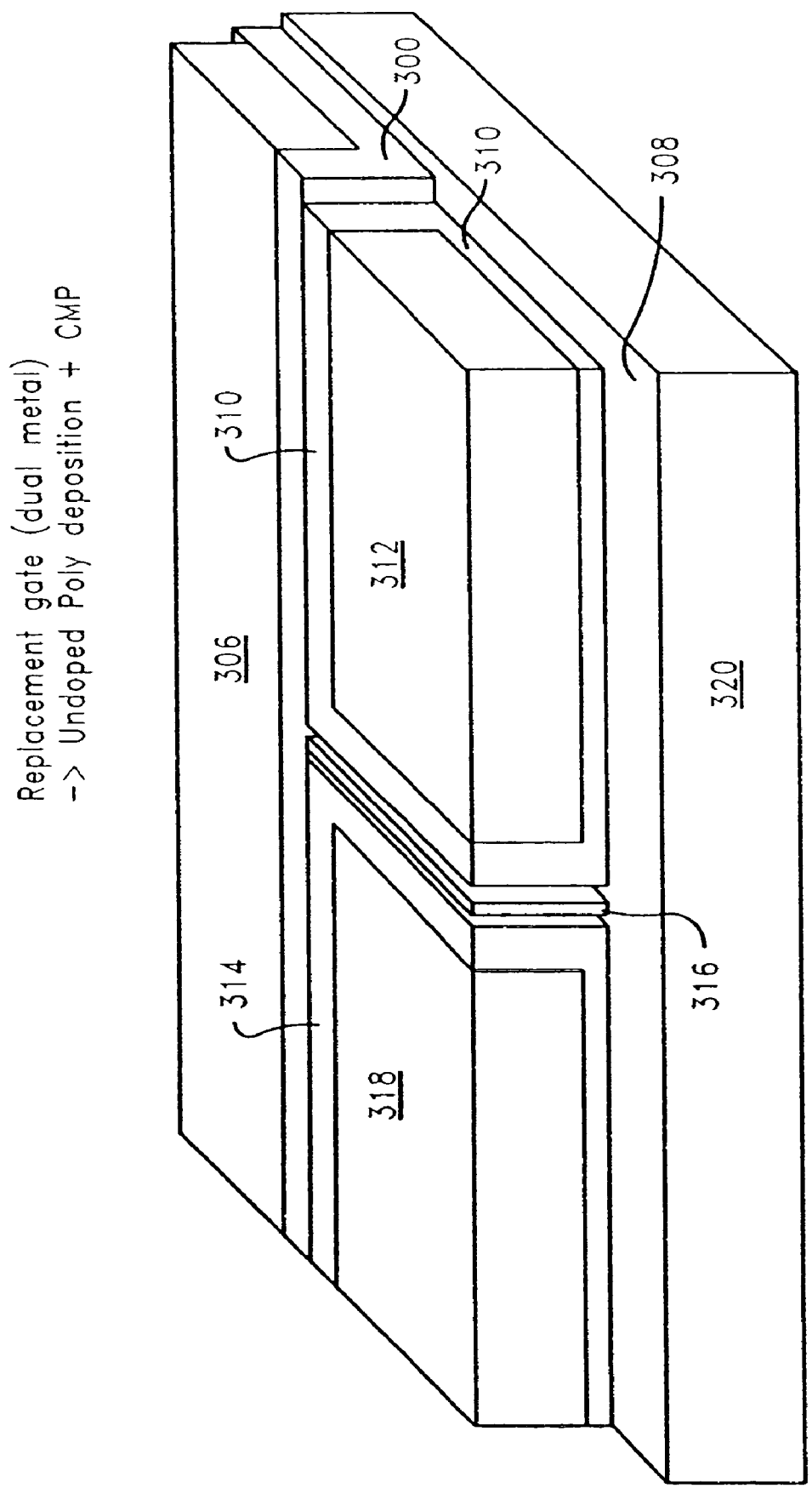
FIG. 10C depicts the dual metal pFET replacement gate of FIG. 10A with a second undoped poly, a pFET metal gate and a gate dielectric replacing the P+poly and sacrificial gate oxide.
Figure 10D:
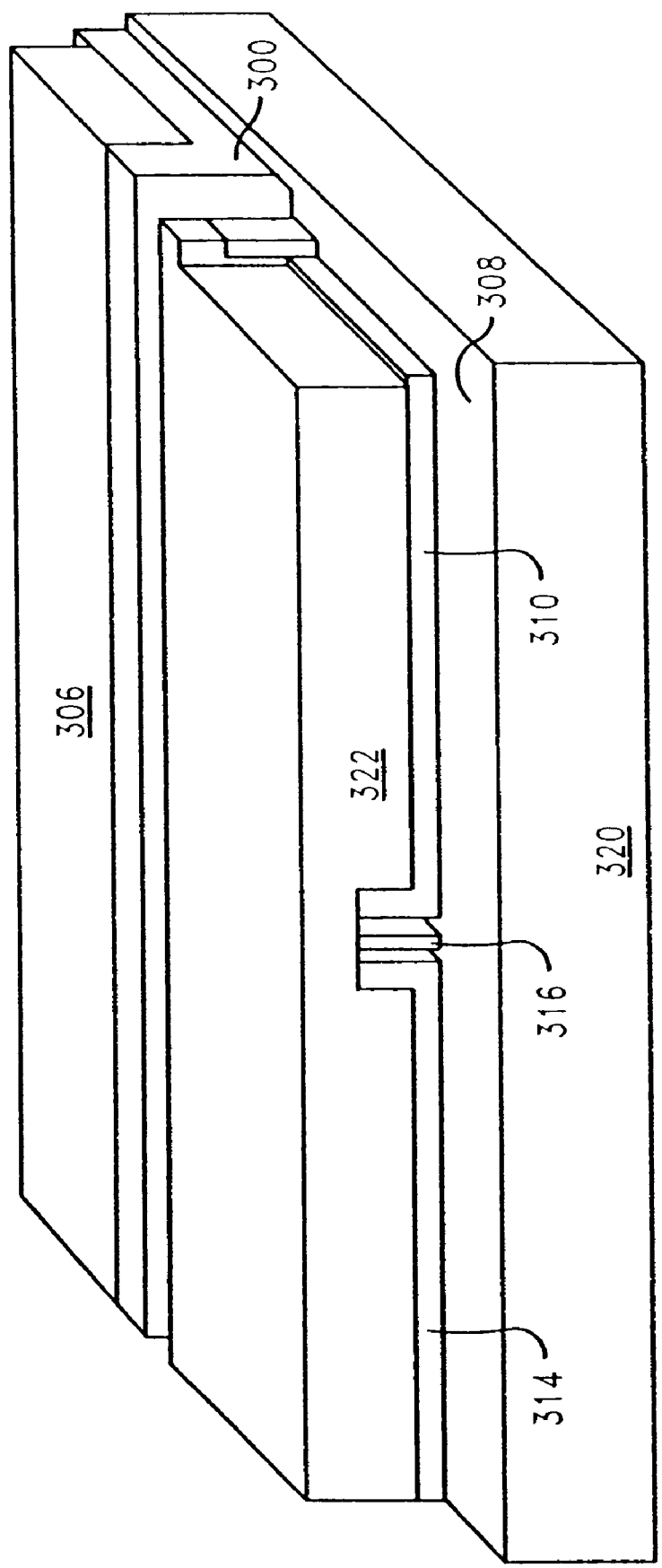
FIG. 10D depicts an additional poly-silicon layer deposited over the CMOS dual metal replacement gate of FIG. 10C.
Figure 10E:
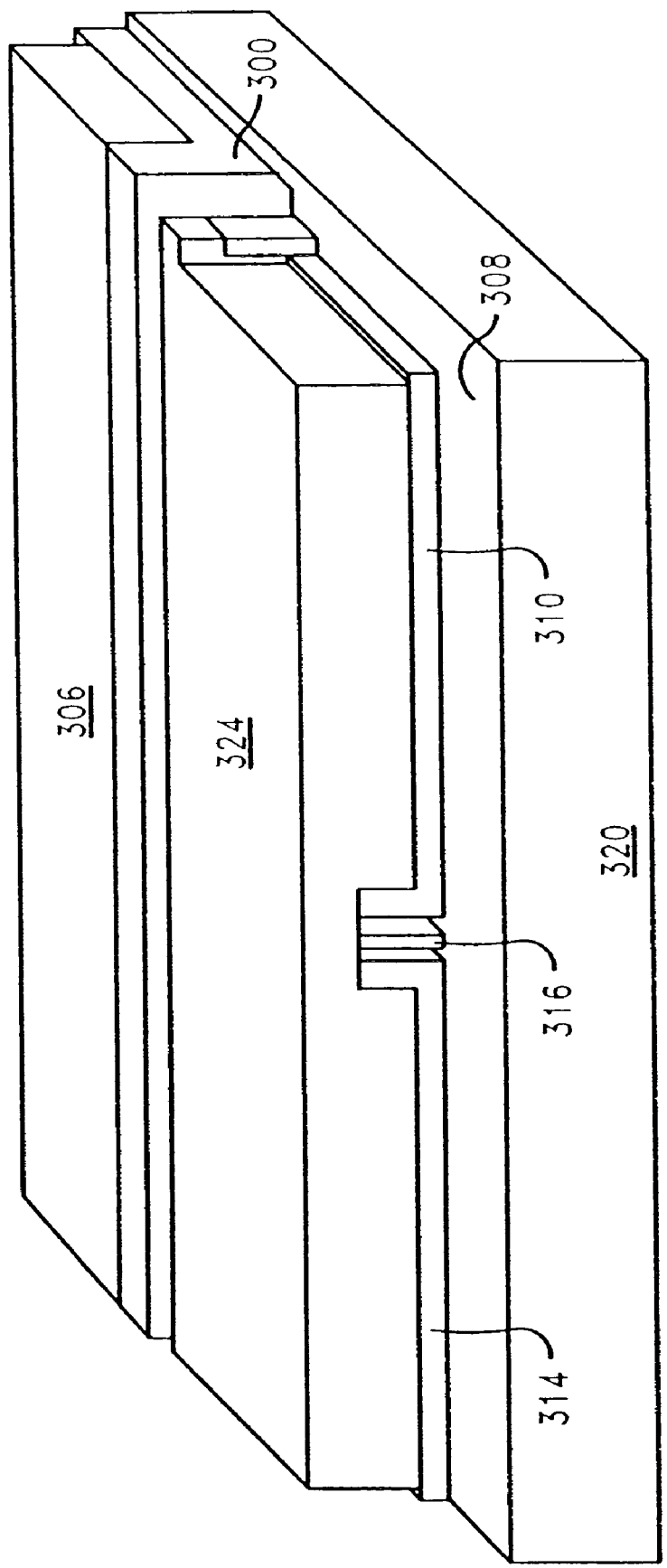
FIG. 10E depicts the dual metal replacement gate of FIG. 10D after formation of the polysilicon and formation of the $CoSi_2$ using the silicide process connecting the nFET and pFET gates.

The invention may also be employed as a technique for a CMOS dual metal replacement gate. FIG. 10A depicts a CMOS dual metal replacement gate having two poly regions 302, 304. A nitride layer 300 separates a P+poly 302 and an N+poly 304 from an HDP oxide 306. The poly layer 302, 304 are on top of a sacrificial gate oxide 308, which rests on substrate 320. The replacement technique comprises first removing the N+poly 304 and sacrificial gate oxide 308, and depositing a new gate dielectric and first nFET metal 310 on the gate dielectric. An undoped poly 312 is then deposited on first metal 310. The structure is then polished (CMP) as shown in FIG. 10B. In a similar fashion, the P+poly 302 is removed along with the sacrificial gate oxide underneath it, a new gate dielectric is deposited and then second pFET metal 314 is deposited over the dielectric. The two metals may be separated by a metal oxide ($Mo_x$) 316, or the like. Another undoped poly318 is formed on the second metal 314. FIG. 10C depicts the replacement gate with a second undoped poly deposition after polishing. The liner is then etched back between the two undoped poly regions 312, 318 and a poly-si layer 322 is deposited over the structure. FIG. 10D depicts the poly-si layer 322 deposited over the metal liners 310, 314. A reactive ion etch (RIE) or further chemical-mechanical polishing may be performed. Co is then deposited over the undoped poly and silicidation is performed, forming $COSi_2$ 324, with the resultant structure as shown in FIG. 10E. The $COSi_2$ formed connects the gates of the nFET and pFET devices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for forming a complementary metal oxide semiconductor (CMOS) device, comprising:
   providing a semi conducting substrate having a gate with a source and a drain region, said gate including a gate dielectric layer and a metal gate layer;
   depositing said gate dielectric layer on said semi conducting substrate;
   depositing said metal gate layer on said gate dielectric layer;
   capping said metal gate layer with a silicon layer formed on top of said metal gate layer such that said silicon layer is deposited at a thickness greater than said metal gate layer;
   and annealing said silicon and metal gate layer such that a reaction occurs to completely form a silicide such that said silicon layer is entirely consumed in said suicide formation; and
   performing conventional formation of said CMOS device.

2. The method of claim 1 wherein said metal gate layer comprises a metal or metal alloy.

3. The method of claim 1 wherein said gate dielectric layer comprises $Al_2O_3$, $HfO_2$, $ZrO_3$, $Y_2O_3$, $La_2O_3$, $SiO_2$, nitrided $SiO_2$, $Si_3N_4$, silicates, metal oxides or mixtures and nitrogen additions thereof.

4. The method of claim 1 wherein said metal gate layer comprises Ru, Rh, W, Mo, Re, Ir, Pt, TiN, TaN, or TaSiN.

5. The method of claim 1 further comprising capping said metal gate layer with $COSi_2$, NiSi, $TiSi_2$, $WSi_2$, $TaSi_2$, $MOSi_2$, PdSi, PtSi or mixtures thereof.

6. The method of claim 1 further comprising capping said metal gate layer with a NiSi, $COSi_2$, $TiSi_2$, or $WSi_2$ suicide.

7. A method of forming a gate metal suicide for CMOS devices on a semiconductor wafer comprising:
   depositing a gate dielectric layer on said wafer; depositing a metal gate layer on top of said gate dielectric layer;
   depositing a silicon layer thicker than said metal gate layer such that at least a portion of said metal gate layer and polysilicon layer are partially consumed in the silicide formation;
   patterning said wafer to form gates; depositing sidewall spacer material;
   etching said wafer to form sidewall spacers;
   performing source and drain ion implantation;
   annealing said wafer at a temperature sufficient to activate implantation species and form a first silicide of said gate silicon layer; and
   forming a second silicide on said first silicide layer.

8. The method of claim 7 comprising forming said third suicide of $COSi_2$, NiSi, $WSi_2$, $TiSi_2$, PtSi, and PdSi.

9. The method of claim 7 wherein depositing said metal gate layer comprises depositing Co, W, Mo, Ru, Rh, Re, or Ir.

10. The method of claim 9 further comprising forming a second suicide layer of a metal different than said metal gate layer over said silicon layer, said second suicide layer comprising Co, W, Ti, Ta, Ni, or Mo.

11. The method of claim 7 further comprising depositing a barrier layer over said metal gate layer to prevent silicide formation of said gate metal layer.

12. The method of claim 11 wherein said barrier layer comprises graded nitride compositions comprising TiN, TaSiN, WN, TiAlN or TaN.

13. A method of forming an interconnect on a dual metal replacement gate structure for connection of nFET and pFET gates of a CMOS device on a semiconductor wafer, comprising:
   providing a patterned gate structure having a gate region comprising a sacrificial gate dielectric, sidewall spacers, shallow trench isolation, source and drain ion implantation regions, and a first and a second doped polysilicon regions over said sacrificial gate dielectric;
   depositing a $Si_3N_4/SiO_2$ bilayer surrounding said gate region;
   removing said first N+doped polysilicon region and a portion of said sacrificial gate dielectric;
   depositing a first dielectric;
   depositing a first nFET metal in place of said first N+doped polysilicon region;
   depositing an undoped polysilicon over said first nFET metal;
   performing chemical mechanical polishing on said wafer;
   removing said second P+doped polysilicon region and a portion of said sacrificial gate dielectric;
   depositing a second dielectric;
   depositing a second pFET metal in place of said second P+doped polysilicon region;
   depositing an undoped polysilicon over said second pFET metal;
   performing chemical mechanical polishing on said wafer;
   performing an etch on said first and second metals between said first and second polysilicon regions;
   depositing a blanket polysilicon layer over said wafer;
   planarizing said deposited polysilicon;
   depositing a metal over said polysilicon layer; and
   performing silicidation of said metal.

* * * * *